United States Patent
D'Souza et al.

(10) Patent No.: US 6,965,273 B2
(45) Date of Patent: Nov. 15, 2005

(54) OSCILLATOR WITH IMPROVED PARAMETERS VARIATION TOLERANCE

(75) Inventors: Lewelyn D'Souza, San Jose, CA (US); Yuwen Swei, Fremont, CA (US)

(73) Assignee: Via Technologies, Inc., Taipei (TW)

(*) Notice: Subject to any disclaimer, the term of this patent is extended or adjusted under 35 U.S.C. 154(b) by 67 days.

(21) Appl. No.: 10/815,219

(22) Filed: Mar. 30, 2004

(65) Prior Publication Data

US 2005/0225401 A1    Oct. 13, 2005

(51) Int. Cl.[7] .................. H03B 5/24; H03H 11/16
(52) U.S. Cl. .............. 331/57; 331/34; 331/177 R; 327/256; 327/257
(58) Field of Search ............ 331/34, 57, 177 R; 326/104, 112, 115, 119–122; 327/171, 237, 327/256–257, 288

(56) References Cited

U.S. PATENT DOCUMENTS 4,939,390 A * 7/1990 Coe .................... 326/115
5,418,498 A * 5/1995 DeVito et al. ............ 331/57
6,043,719 A   3/2000 Lin et al.

* cited by examiner

Primary Examiner—David Mis

(74) Attorney, Agent, or Firm—Hickman Palermo Truong & Becker, LLP

(57) ABSTRACT

A design for an inverting delay component of an oscillator is disclosed, which enables the oscillator to be more tolerant of parameter variations. This increased parameter variation tolerance allows the $K_{VCO}$ of the oscillator to vary less between the worst case scenario (where the components of the oscillator meet minimum specifications) and the best case scenario (where the components meet the maximum specifications). This in turn means that the worst case $K_{VCO}$ value will be significantly smaller than in the prior art. By using a significantly smaller $K_{VCO}$ value, the jitter experienced at the output of the oscillator will be substantially reduced. Thus, this design enables a low-jitter oscillator to be realized.

20 Claims, 4 Drawing Sheets

OSCILLATOR WITH IMPROVED PARAMETERS VARIATION TOLERANCE

FIELD OF THE INVENTION

This invention relates generally to electronic circuits, and more particularly to an oscillator with improved parameter variation tolerance.

BACKGROUND

Many of today's electronic devices (e.g. cell phones, computers, personal digital assistants (PDA's), etc.) require high frequency clock signals in order to operate. Usually, these clock signals are generated using phase locked loops (PLL's).

A typical PLL comprises a phase detector, a loop filter, a charge pump, and a voltage controlled oscillator (VCO). While all of the components perform vital functions, it is really the VCO that is at the heart of the PLL because it is the VCO that provides the output high frequency signals, and it is the VCO that enables the frequencies of the output signals to be adjusted based upon a control voltage signal.

In designing a PLL, one of the starting points is the selection of an output frequency/control voltage value for the VCO. This value, referred to herein as $K_{VCO}$, specifies how much the output frequency of the VCO will change given a change in control voltage. A sample $K_{VCO}$ plot is shown in FIG. 1, wherein the control voltage is shown along the X axis and the output frequency is shown along the Y axis. The $K_{VCO}$ value is given by the slope of the plot. Since the plot in FIG. 1 is a straight line, the $K_{VCO}$ value is a constant. In practice, the $K_{VCO}$ will most likely vary with the control voltage and hence, would not be a constant. Nonetheless, to simplify the design process, a constant $K_{VCO}$ value is used as an approximation. After the $K_{VCO}$ value is selected, it is used to determine the parameters of the other PLL components. In this manner, the PLL is designed around the VCO.

The $K_{VCO}$ value that is selected for a PLL depends upon the particular VCO that is to be used. For the particular VCO, there will be a variety of $K_{VCO}$ values that can be selected. This variety results not from any defect in the design of the VCO, but rather from the processing variations that are encountered in fabricating the VCO.

More specifically, a VCO comprises a plurality of components (e.g. transistors). These components are manufactured by some fabrication process. Ideally, the fabrication process should produce identical components (components with the same parameters) each and every time. In practice, however, this is not possible. As a result, there will be some variation in the parameters of the components used to make up the VCO. Some of the components will have parameters that barely meet minimum specifications, while other components will meet or exceed the maximum specifications, while other components will fall somewhere in between. Because of these processing variations, the $K_{VCO}$ values exhibited by different VCO's will differ, even if the VCO's are all of the identical design. This means that in selecting a $K_{VCO}$ value, a PLL designer has to select a value that all of the VCO's will be able to minimally achieve, which typically means that the designer has to choose the worst case $K_{VCO}$ value.

FIG. 2 shows some sample $K_{VCO}$ plots for a VCO, to illustrate the various possible $K_{VCO}$ values that can be exhibited by different VCO's of the same design. In FIG. 2, the KVCO1 plot shows the $K_{VCO}$ value for the worst case scenario (where the components of the VCO meet minimum specifications), the KVCO3 plot shows the $K_{VCO}$ value for the best case scenario (where the components meet the maximum specifications), and the KVCO2 plot shows the $K_{VCO}$ value for the typical case. As can be seen, the worst case scenario plot KVCO1 has the steepest slope. As noted above, a PLL designer typically has to select the worst case scenario to ensure that the PLL will work for all of the different VCO's of the same design. This, in turn, means that the designer has to choose the highest $K_{VCO}$ value (the plot KVCO1 with the steepest slope).

Using such a high $K_{VCO}$ value is problematic in many implementations, however. To elaborate, the $K_{VCO}$ value indicates how much the output frequency of the VCO will change given a change in control voltage. With a large $K_{VCO}$ value, even a small change in control voltage will cause a significant change in output frequency. This in turn means that if the control voltage has any noise components, those noise components will cause significant fluctuations (referred to herein as "jitter") in the output frequency. This jitter is highly undesirable as it can cause some devices to operate improperly. Thus, using a large $K_{VCO}$ value in the design of a PLL has significant drawbacks.

SUMMARY

In accordance with one embodiment of the present invention, there is provided a design for an inverting delay component of an oscillator, which enables the oscillator to be more tolerant of parameter variations. This increased parameter variation tolerance allows the $K_{VCO}$ of the oscillator to vary less between the worst case scenario (where the components of the oscillator meet minimum specifications) and the best case scenario (where the components meet the maximum specifications). This in turn means that the worst case $K_{VCO}$ value will be significantly smaller than in the prior art. By using a significantly smaller $K_{VCO}$ value, the jitter experienced at the output of the oscillator will be substantially reduced. Thus, this embodiment of the present invention enables a low-jitter oscillator to be realized.

In one embodiment, the inverting delay component discussed above comprises an inverting portion and a delay control portion. The inverting portion has an input terminal, a complementary input terminal, an output terminal, and a complementary output terminal. The inverting portion performs an inverting function such that the signal at the output terminal is an inverted version of the signal at the complementary input terminal, and the signal at the complementary output terminal is an inverted version of the signal at the input terminal.

The delay control portion comprises a first current source coupled to the output terminal of the inverting portion, and a second current source coupled to the complementary output terminal of the inverting portion. Each current source is coupled to receive a control signal for controlling the current produced by the current source, which in turn, determines the delay imposed by the delay control portion. The first current source, having a first impedance, has a first resistive element coupled thereto. Likewise, the second current source, having a second impedance, has a second resistive element coupled. It has been observed that coupling the resistive elements to the current sources causes each current source to exhibit a much larger output impedance than it otherwise would exhibit (that is, the first current source exhibits an output impedance much larger than the first impedance, and the second current source exhibits an output impedance much larger than the second impedance).

An n number (where n is an odd integer greater than one) of the above inverting delay components may be coupled together in series in a closed loop circuit to implement an oscillator. It has been observed that the increased output impedances of the current sources of the inverting delay components enable the oscillator to be more tolerant of parameter variations. Put another way, the increased output impedances enable the $K_{VCO}$ value of the oscillator to vary less between the worst case scenario and the best case scenario. As a result, the worst case $K_{VCO}$ value will be significantly smaller than in the prior art, which in turn enables the oscillator to experience much less jitter. Overall, this embodiment of the present invention enables an improved oscillator to be realized.

DETAILED DESCRIPTION OF EMBODIMENT(S)

Figure 3:
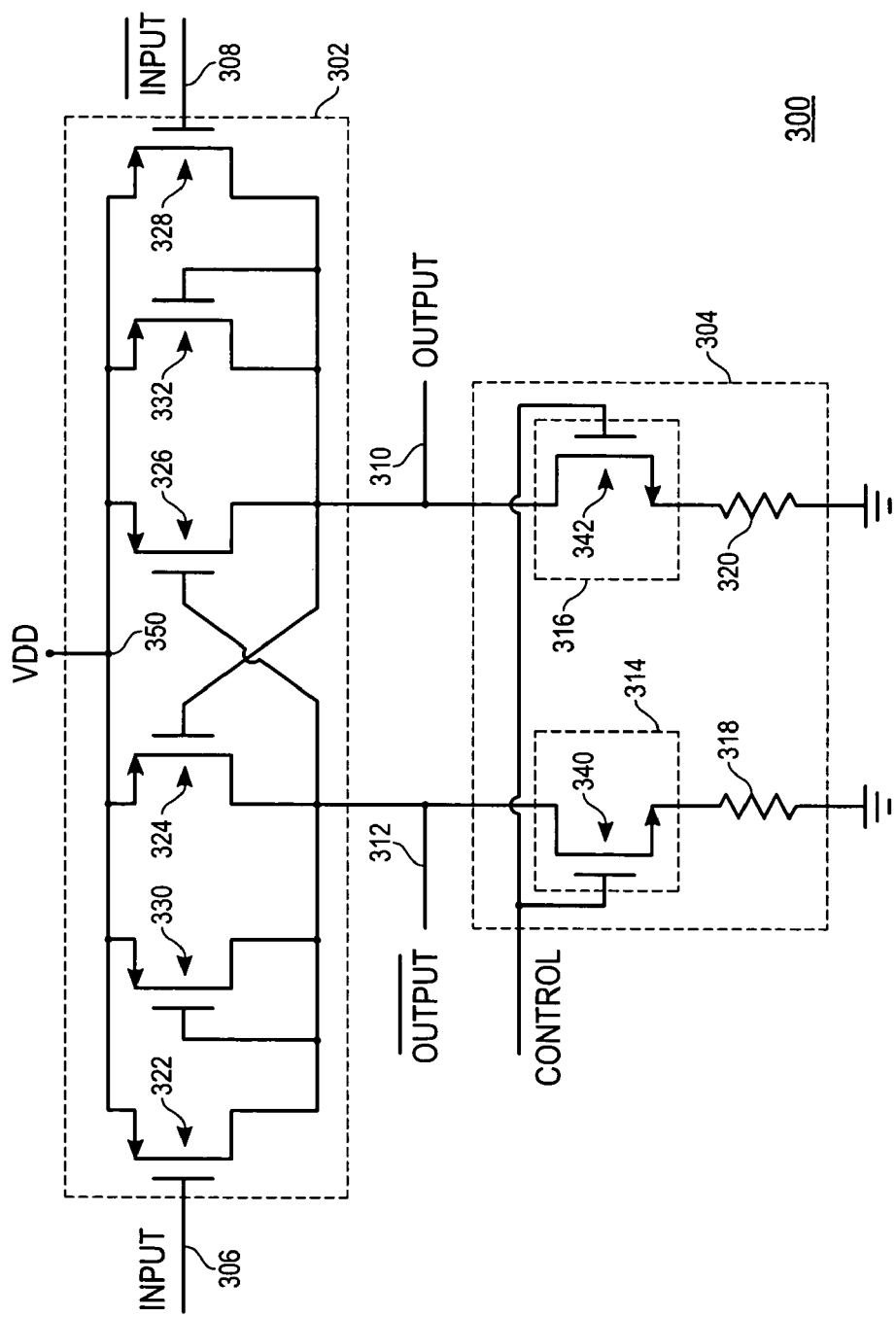
FIG. 3 is a circuit diagram of an inverting delay component in accordance with one embodiment of the present invention.

With reference to FIG. 3, there is shown a circuit diagram for an inverting delay component 300 in accordance with one embodiment of the present invention. As shown, the inverting delay component 300 comprises an inverting portion 302 and a delay control portion 304.

Inverting Portion

The inverting portion 302 comprises an input terminal 306 for receiving an input signal, a complementary input terminal 308 for receiving a complement of the input signal, an output terminal 310 for providing an output signal, and a complementary output terminal 312 for providing a complement of the output signal. The inverting portion 302 performs an inverting function such that the output signal is an inverted version of the complement of the input signal, and the complement of the output signal is an inverted version of the input signal.

In one embodiment, the inverting portion 302 comprises six transistors, namely, transistors 322, 330, 324, 326, 332, and 328 (in one embodiment, each of these transistors takes the form of a P-type MOSFET). Transistors 322 and 328 act as input transistors for receiving the input signals 306, 308, respectively. More specifically, transistor 322 has a gate terminal coupled to receive the input signal 306, a source terminal coupled to node 350 which, in the circuit of FIG. 3, is coupled to a supply voltage VDD, and a drain terminal coupled to the complementary output terminal 312. Similarly, transistor 328 has a gate terminal coupled to receive the complementary input signal 308, a source terminal coupled to node 350, and a drain terminal coupled to the output terminal 310.

The two middle transistors 324 and 326 are cross-coupled to form a latch. In one embodiment, it is these transistors 324, 326 that provide the inverting action of the inverting portion 302. By cross-coupled, it is meant that the gate terminal of each transistor 324, 326 is coupled to the drain terminal of the other transistor. Thus, transistor 324 has its gate terminal coupled to the drain terminal of transistor 326 (which in turn is coupled to the output terminal 310), a source terminal coupled to node 350, and a drain terminal coupled to the complementary output terminal 312. Similarly, transistor 326 has its gate terminal coupled to the drain terminal of transistor 324 (which in turn is coupled to the complementary output terminal 312), a source terminal coupled to node 350, and a drain terminal coupled to the output terminal 310.

Voltage swings across the latch are controlled (in one embodiment, are kept fairly constant) by transistors 330 and 332. In one embodiment, transistors 330 and 332 are electrically coupled such that each acts as an active load device. More specifically, transistor 330 has its gate terminal coupled to its drain terminal to form an active load device with the form of a diode. Transistor 330 further has its source terminal coupled to node 350. Similarly, transistor 332 has its gate terminal coupled to its drain terminal to form an active load device with the form of a diode. Transistor 332 further has its source terminal coupled to node 350.

As shown in FIG. 3, the drain terminals of transistors 322, 330, and 324 are all coupled to the complementary output terminal 312. Likewise, the drain terminals of transistors 326, 332, and 328 are all coupled to the output terminal 310. Coupled in the manner shown in FIG. 3, transistors 322, 330, 324, 326, 332, and 328 interact to perform an inverting function. In one embodiment, the signal provided at the output terminal 310 is an inverted version of the signal received at the complementary input terminal 308, and the signal provided at the complementary output terminal 312 is an inverted version of the signal received at the input terminal 306.

Delay Control Portion

The delay control portion 304 is coupled to the output terminal 310 and the complementary output terminal 312 to receive the signals on those terminals. The delay control portion 304 determines the delay that is experienced by the overall inverting delay component 300. This delay is controlled by a control signal.

In one embodiment, the delay control portion 304 comprises a first current source 314 coupled to the complementary output terminal 312, and a second source 316 coupled to the output terminal 310. In one embodiment, the first current source 314 takes the form of a transistor 340 (in one embodiment, an N-type MOSFET) having a gate terminal coupled to receive the control signal, a drain terminal coupled to the complementary output terminal 312, and a source terminal. The second current source 316, in one embodiment, takes the form of a transistor 342 (in one embodiment, an N-type MOSFET) having a gate terminal coupled to receive the control signal, a drain terminal coupled to the output terminal 310, and a source terminal. The control signal controls the amount of current produced by each current source 314, 316, which in turn, determines the delay imposed by the delay control portion 304. Each current source 314, 316 has an associated impedance, i.e. the first current source 314 has a first impedance and the second current source 316 has a second impedance.

In one embodiment, each current source 314, 316 has a resistive element coupled thereto. More specifically, resistive element 318 is coupled to the source terminal of transistor 340, and resistive element 320 is coupled to the source terminal of transistor 342. In one embodiment, resistive elements 318, 320 take the form of resistors. It has been observed that the presence of resistive elements 318 and 320 significantly increases the output impedances exhibited by the current sources 314, 316 (through a phenomenon known as source degeneration). More specifically, looking into the drain terminal of transistor 340, the output impedance exhibited by the first current source 314 is much greater (in one embodiment, many fold greater) than the first impedance of the first current source 314. Similarly, looking into the drain terminal of transistor 342, the output impedance exhibited by the second current source 316 is much greater (in one embodiment, many fold greater) than the second impedance of the second current source 316. Thus, the resistive elements 318, 320 enable the current sources 314, 316 to exhibit much greater output impedances than they normally would exhibit. The significance of this will be elaborated upon in a later section.

Oscillator

Figure 4:
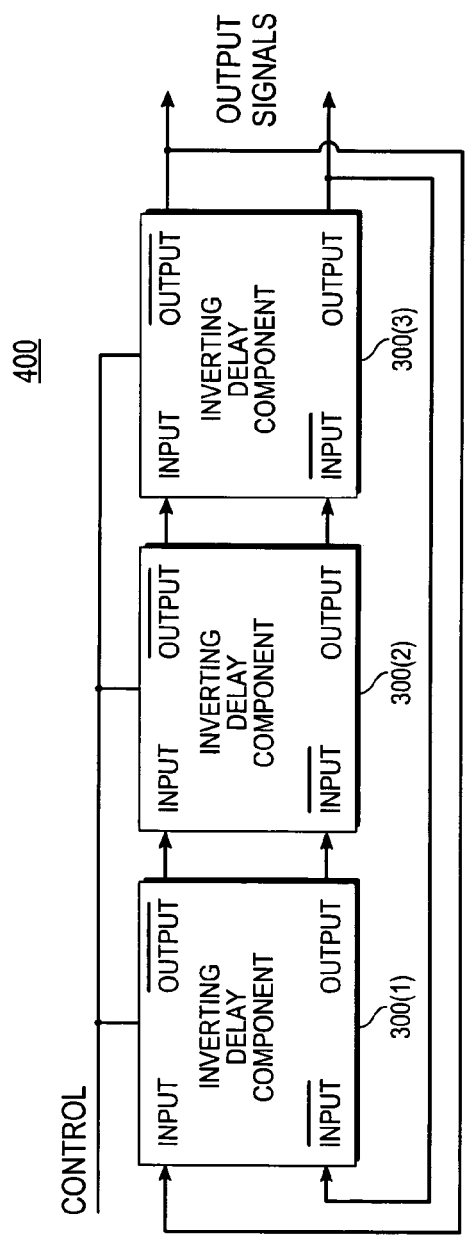
FIG. 4 is a functional block diagram of an oscillator that can be formed using the inverting delay component of FIG. 3.

A plurality of the inverting delay components 300 shown in FIG. 3 may be coupled together in series in a closed loop circuit to form an oscillator. A sample oscillator 400 is shown in FIG. 4. In FIG. 4, three inverting delay components 300 are shown for the sake of illustration. It should be noted though that any n number of inverting delay components 300 may be used, where n is an odd integer greater than one.

As shown in FIG. 4, each inverting delay component 300 has: (1) an input terminal coupled to the complementary output terminal of a preceding inverting delay component 300; (2) a complementary input terminal coupled to the output terminal of the preceding inverting delay component 300; (3) a complementary output terminal coupled to the input terminal of a succeeding inverting delay component 300; and (4) an output terminal coupled to the complementary input terminal of the succeeding inverting delay component 300. Because the inverting delay components 300 are coupled together in a closed loop, the last inverting delay component 300(3) acts as the preceding inverting delay component for the first inverting delay component 300(1), and the first inverting delay component 300(1) acts as the succeeding inverting delay component for the last inverting delay component 300(3).

Each inverting delay component 300 is coupled to receive a control signal. This control signal controls the delay imposed by each inverting delay component 300. By controlling this delay, the frequency of the output signals provided by the oscillator 400 can be controlled.

As noted previously with reference to FIG. 3, the resistive elements 318, 320 enable the current sources 314 and 316 to exhibit much greater output impedances. It has been observed that these increased output impedances enable the oscillator 400 to be much more tolerant of parameter variations in the components (e.g. transistors 322, 330, 324, 326, 332, 328, 340, and 342) that make up the oscillator 400.

Figure 5:
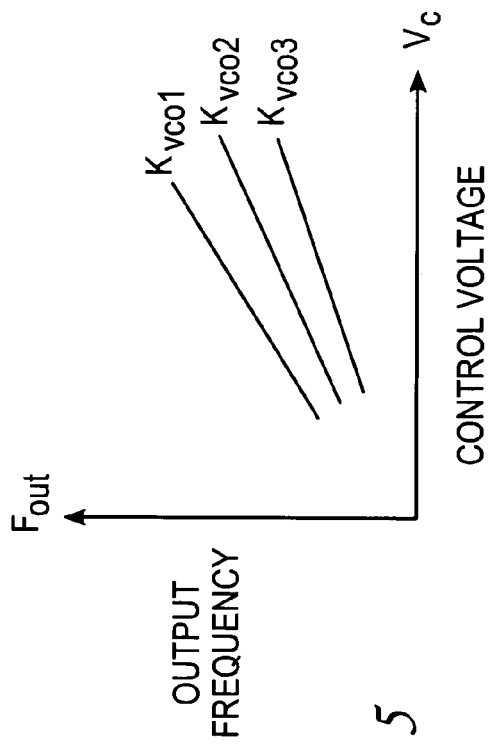
FIG. 5 shows some sample $K_{VCO}$ plots for the oscillator of FIG. 4, illustrating the reduced variation in $K_{VCO}$ values caused by variations in the parameters of the components used to make up the oscillator.

This increased tolerance is shown in FIG. 5, wherein three qualitative $K_{VCO}$ plots are shown for oscillator 400. The KVCO1 plot shows the $K_{VCO}$ value for the worst case scenario (where the components of the oscillator 400 meet minimum specifications), the KVCO3 plot shows the $K_{VCO}$ value for the best case scenario (where the components meet the maximum specifications), and the KVCO2 plot shows the $K_{VCO}$ value for the typical case.

Figure 1:
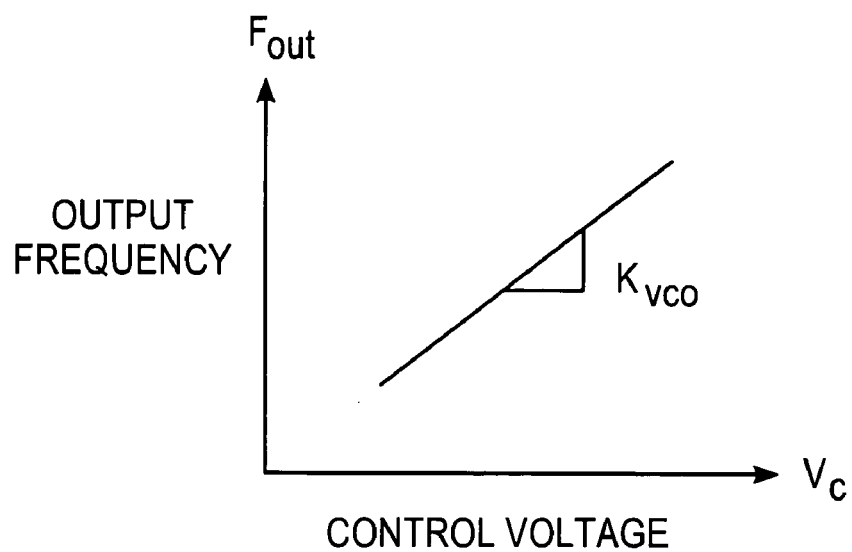
FIG. 1 shows a sample $K_{VCO}$ plot for an oscillator.
Figure 2:
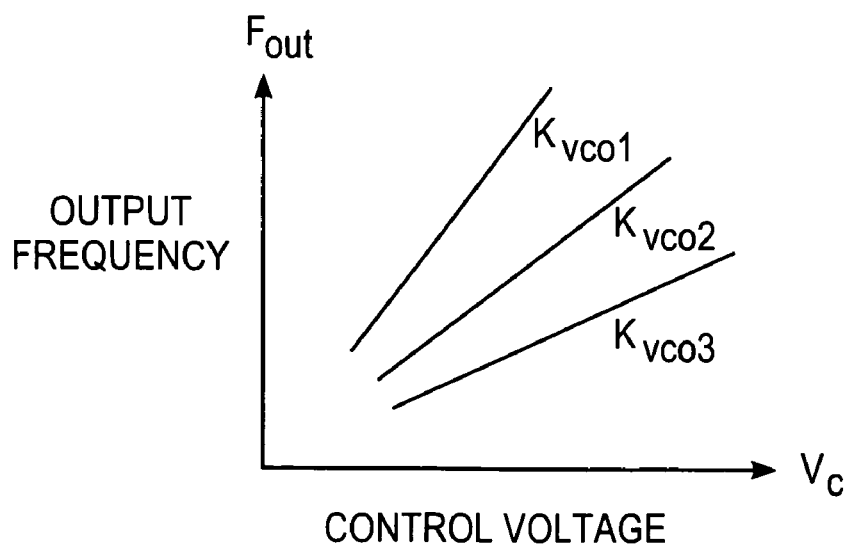
FIG. 2 shows some sample $K_{VCO}$ plots for a VCO, illustrating the various possible $K_{VCO}$ values that can be exhibited as a result of variations in the parameters of the components used to make up the VCO.

Comparing the plots shown in FIG. 5 with the plots shown in FIG. 2, several observations can be made. First, it can be observed that there is significantly less variation between the worst case and best case scenario plots in FIG. 5 than in FIG. 2. This shows that the oscillator 400 of FIG. 4 is capable of tolerating component parameter variation much better than the prior art. Also, it can be observed that the slope of the worst case plot KVCO1 in FIG. 5 is significantly smaller than the slope of the worst case plot KVCO1 in FIG. 2. This means that the oscillator 400 of FIG. 4 will experience much less jitter in its output signals than the prior art. Overall, the oscillator 400 of FIG. 4 represents a significant improvement over the oscillators of the prior art.

ALTERNATIVE EMBODIMENTS

In FIG. 3, the resistive elements 318 and 320 are shown as resistors. It should be noted that other types of components may be used, if so desired. For example, transistors that are biased to behave like resistors may be used. For purposes of the present invention, any component that behaves like a resistor may be used to implement the resistive elements 318, 320.

Figure 6:
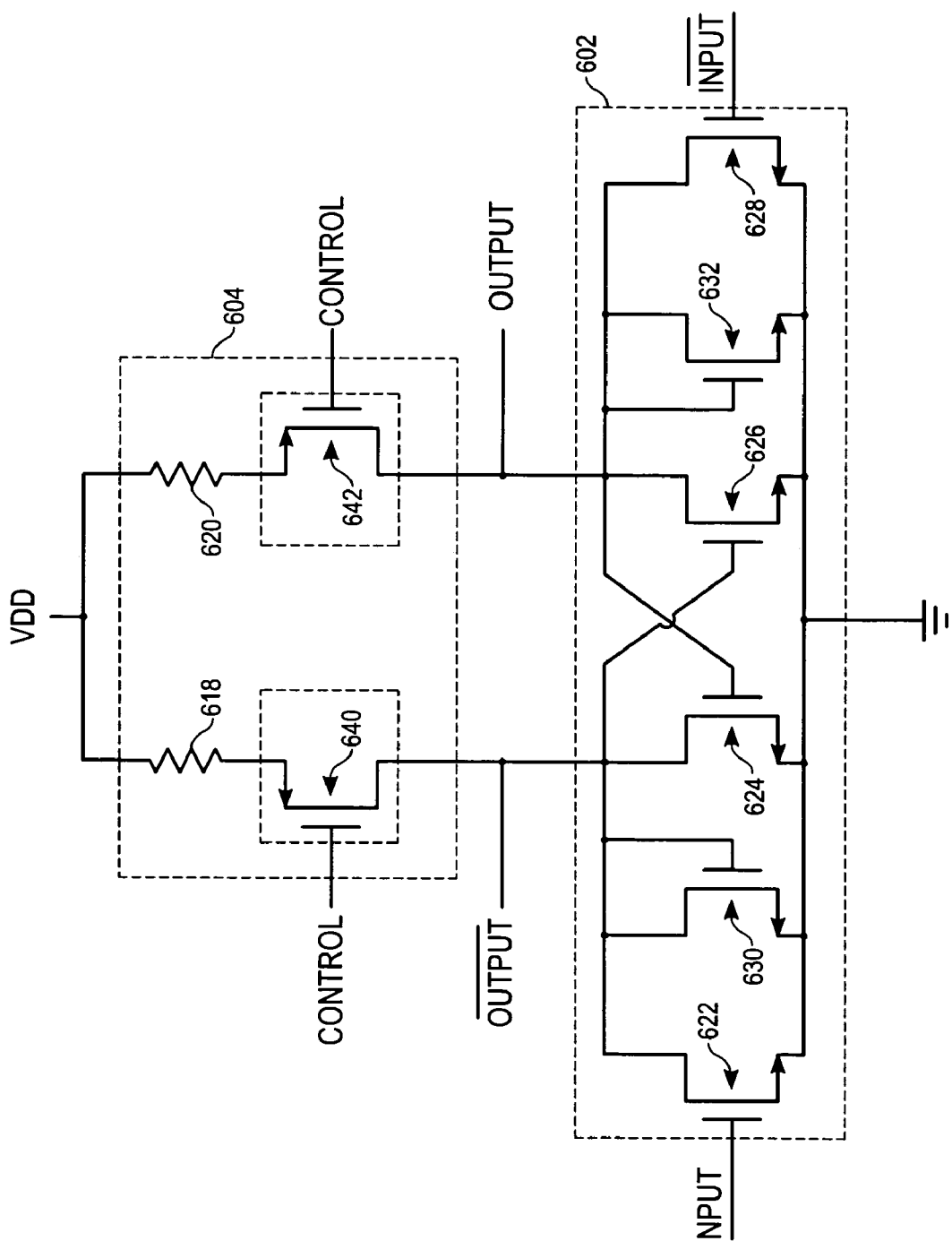
FIG. 6 is a circuit diagram of an inverting delay component in accordance with an alternate embodiment of the present invention.

Also, in FIG. 3, the transistors 322, 330, 324, 326, 332, and 328 of the inverting portion 302 have been described as P-type transistors and the transistors 340 and 342 of the delay control portion 304 have been described as N-type transistors. If so desired, this can be changed so that the transistors of the inverting portion are N-type and the transistors of the delay control portion are P-type. An example of such an inverting delay component 600 is shown in FIG. 6, wherein the transistors 622, 630, 624, 626, 632, and 628 of the inverting portion 602 are N-type, and the transistors 640, 642 of the delay control portion 604 are P-type. These and other modifications are within the scope of the present invention.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the issued claims.

What is claimed is:

1. An inverting delay component, comprising:
   an inverting portion having an input terminal for receiving an input signal, a complementary input terminal for receiving a complement of the input signal, an output terminal for providing an output signal, and a complementary output terminal for providing a complement of the output signal, the inverting portion performing an inverting function such that the output signal is an inverted version of the complement of the input signal, and the complement of the output signal is an inverted version of the input signal; and
   a delay control portion, comprising:
      a first current source having a first impedance, the first current source coupled to the complementary output terminal and also coupled to receive a control signal;
      a first resistive element coupled to the first current source, the first resistive element causing the first current source to exhibit an output impedance which is much larger than the first impedance;

a second current source having a second impedance, the second current source coupled to the output terminal and also coupled to receive the control signal; and a second resistive element coupled to the second current source, the second resistive element causing the second current source to exhibit an output impedance which is much larger than the second impedance.

2. The component of claim 1, wherein the first current source comprises a first transistor having a drain terminal coupled to the complementary output terminal, a gate terminal coupled to receive the control signal, and a source terminal coupled to the first resistive element.

3. The component of claim 2, wherein the second current source comprises a second transistor having a drain terminal coupled to the output terminal, a gate terminal coupled to receive the control signal, and a source terminal coupled to the second resistive element.

4. The component of claim 3, wherein the first resistive element comprises a first resistor and the second resistive element comprises a second resistor.

5. The component of claim 3, wherein the first resistive element comprises a third transistor biased to behave like a resistor, and the second resistive element comprises a forth transistor biased to behave like a resistor.

6. The component of claim 1, wherein the inverting portion comprises:
a first transistor having a gate terminal coupled to the input terminal, a drain terminal coupled to the complementary output terminal, and a source terminal coupled to a first node;
a second transistor having a gate terminal coupled to the complementary input terminal, a drain terminal coupled to the output terminal, and a source terminal coupled to the first node;
a third transistor having a gate terminal coupled to the output terminal, a drain terminal coupled to the complementary output terminal, and a source terminal coupled to the first node; and
a fourth transistor having a gate terminal coupled to the complementary output terminal, a drain terminal coupled to the output terminal, and a source terminal coupled to the first node.

7. The component of claim 6, wherein the inverting portion further comprises:
a fifth transistor having a gate terminal coupled to the complementary output terminal, a drain terminal coupled to the complementary output terminal, and a source terminal coupled to the first node; and
a sixth transistor having a gate terminal coupled to the output terminal, a drain terminal coupled to the output terminal, and a source terminal coupled to the first node.

8. The component of claim 7, wherein the first current source comprises a seventh transistor having a drain terminal coupled to the complementary output terminal, a gate terminal coupled to receive the control signal, and a source terminal coupled to the first resistive element, and wherein the second current source comprises an eighth transistor having a drain terminal coupled to the output terminal, a gate terminal coupled to receive the control signal, and a source terminal coupled to the second resistive element.

9. The component of claim 8, wherein the first resistive element comprises a first resistor, and wherein the second resistive element comprises a second resistor.

10. The component of claim 8, wherein the first resistive element comprises a ninth transistor biased to behave like a resistor, and the second resistive element comprises a tenth transistor biased to behave like a resistor.

11. An oscillator, comprising:
an n number of inverting delay components coupled in series to form a closed loop circuit, where n is an odd integer greater than one, each inverting delay component comprising:
an inverting portion having an input terminal for receiving an input signal, a complementary input terminal for receiving a complement of the input signal, an output terminal for providing an output signal, and a complementary output terminal for providing a complement of the output signal, the inverting portion performing an inverting function such that the output signal is an inverted version of the complement of the input signal, and the complement of the output signal is an inverted version of the input signal; and
a delay control portion, comprising:
a first current source having a first impedance, the first current source coupled to the complementary output terminal and also coupled to receive a control signal;
a first resistive element coupled to the first current source, the first resistive element causing the first current source to exhibit an output impedance which is much larger than the first impedance;
a second current source having a second impedance, the second current source coupled to the output terminal and also coupled to receive the control signal; and
a second resistive element coupled to the second current source, the second resistive element causing the second current source to exhibit an output impedance which is much larger than the second impedance;
wherein the input terminal and the complementary input terminal are coupled to a complementary output terminal and an output terminal, respectively, of a preceding inverting delay component, and
wherein the output terminal and the complementary output terminal are coupled to a complementary input terminal and an input terminal, respectively, of a succeeding inverting delay element.

12. The oscillator of claim 11, wherein the first current source comprises a first transistor having a drain terminal coupled to the complementary output terminal, a gate terminal coupled to receive the control signal, and a source terminal coupled to the first resistive element.

13. The oscillator of claim 12, wherein the second current source comprises a second transistor having a drain terminal coupled to the output terminal, a gate terminal coupled to receive the control signal, and a source terminal coupled to the second resistive element.

14. The oscillator of claim 13, wherein the first resistive element comprises a first resistor and the second resistive element comprises a second resistor.

15. The oscillator of claim 13, wherein the first resistive element comprises a third transistor biased to behave like a resistor, and the second resistive element comprises a forth transistor biased to behave like a resistor.

16. The oscillator of claim 11, wherein the inverting portion comprises:
a first transistor having a gate terminal coupled to the input terminal, a drain terminal coupled to the complementary output terminal, and a source terminal coupled to a first node;

a second transistor having a gate terminal coupled to the complementary input terminal, a drain terminal coupled to the output terminal, and a source terminal coupled to the first node;

a third transistor having a gate terminal coupled to the output terminal, a drain terminal coupled to the complementary output terminal, and a source terminal coupled to the first node; and a fourth transistor having a gate terminal coupled to the complementary output terminal, a drain terminal coupled to the output terminal, and a source terminal coupled to the first node.

17. The oscillator of claim 16, wherein the inverting portion further comprises:

a fifth transistor having a gate terminal coupled to the complementary output terminal, a drain terminal coupled to the complementary output terminal, and a source terminal coupled to the first node; and a sixth transistor having a gate terminal coupled to the output terminal, a drain terminal coupled to the output terminal, and a source terminal coupled to the first node.

18. The oscillator of claim 17, wherein the first current source comprises a seventh transistor having a drain terminal coupled to the complementary output terminal, a gate terminal coupled to receive the control signal, and a source terminal coupled to the first resistive element, and wherein the second current source comprises an eighth transistor having a drain terminal coupled to the output terminal, a gate terminal coupled to receive the control signal, and a source terminal coupled to the second resistive element.

19. The oscillator of claim 18, wherein the first resistive element comprises a first resistor, and wherein the second resistive element comprises a second resistor.

20. The oscillator of claim 18, wherein the first resistive element comprises a ninth transistor biased to behave like a resistor, and the second resistive element comprises a tenth transistor biased to behave like a resistor.

* * * * *

UNITED STATES PATENT AND TRADEMARK OFFICE
CERTIFICATE OF CORRECTION

PATENT NO.     : 6,965,273 B2
DATED          : November 15, 2005
INVENTOR(S)    : Lewelyn D'Souza et al.

It is certified that error appears in the above-identified patent and that said Letters Patent is hereby corrected as shown below:

Title page,
Item [54], Title, delete "OSCILLATOR WITH IMPROVED PARAMETERS VARIATION TOLERANCE" and insert -- OSCILLATOR WITH IMPROVED PARAMETER VARIATION TOLERANCE --.

Signed and Sealed this

Fourteenth Day of March, 2006

JON W. DUDAS
*Director of the United States Patent and Trademark Office*